(12) United States Patent
Wong

(10) Patent No.: US 7,561,084 B1
(45) Date of Patent: Jul. 14, 2009

(54) SLIDING ERROR SAMPLER (SES) FOR LATENCY REDUCTION IN THE ADC PATH

(75) Inventor: Hee Wong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/904,017

(22) Filed: Sep. 25, 2007

(51) Int. Cl.
  *H03M 1/00* (2006.01)
(52) U.S. Cl. .................................. 341/123; 341/155
(58) Field of Classification Search ................. 341/118, 341/120, 119, 155, 156, 159, 123
  See application file for complete search history.

(56) References Cited

U.S. PATENT DOCUMENTS

| | | | |
|---|---|---|---|
| 7,084,793 B2 * | 8/2006 | Elbornsson | 341/118 |
| 7,167,516 B1 * | 1/2007 | He | 375/232 |
| 7,233,270 B2 * | 6/2007 | Lin | 341/118 |
| 7,425,908 B2 * | 9/2008 | Gremillet | 341/120 |

OTHER PUBLICATIONS

Byung Kook Kim, "Task Scheduling with Feedback Latency for Real-Time Control Systems", pp. 1-5, (1998).
Yoichi Ishizuka et al., "A Low-Delay Digital PWM Control Circuit for DC-DC Converters", IEEE 2007, pp. 579-584.

* cited by examiner

*Primary Examiner*—Brian Young

(57) ABSTRACT

A digital control loop within power switchers and the like includes a sliding error sampler analog-to-digital converter producing an error value for a digital loop iteration. A predictor variably sets the timing for initiating analog-to-digital conversion of the current error value based on the magnitude of a previous error value for a previous loop iteration, plus margins conversion housekeeping and the step size of the next loop iteration. At a timing prior to a filter reading the error value that equals the number of clock cycles set by the predictor, a timing unit triggers the analog-to-digital conversion, reducing loop latency and improving performance.

20 Claims, 19 Drawing Sheets

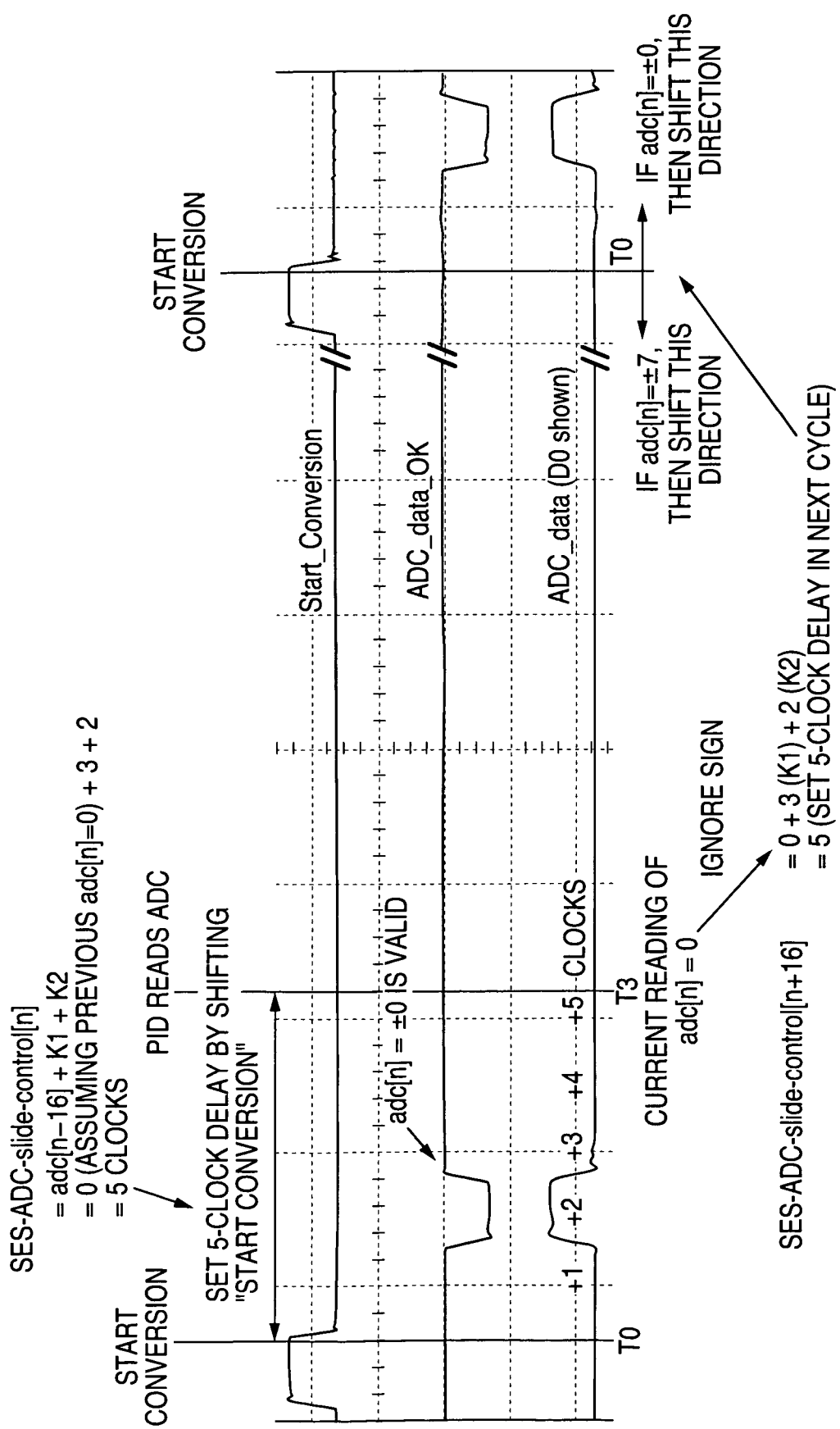

SLIDING ERROR SAMPLER (SES) FOR LATENCY REDUCTION IN THE ADC PATH

TECHNICAL FIELD

The present disclosure is directed, in general, to error signal processing for control loop applications and, more specifically, to adaptive timing in digital control loops to minimize latency.

BACKGROUND

In control systems such as switching power supplies, servo loops and robotic controllers, error detection is the first step before the control loop can execute other functions. The resultant error signal, after shaping with a loop filter, feeds the controlling function of the loop for error correction. Subsequently, the error-corrected signal is fed back to the error detector for further minimization of any residual error. This recursive action exhibits loop latency that reduces the system phase and gain margins. Poor phase and gain margins impair the loop transient and quiescent responses, so loop latency should be minimized in order to achieve good performance.

Digital control loops offer many advantages over the analog counterparts, such as exceptional stability and programmability. However, those digital control loops generally demand power and circuit parallelism to minimize loop latency. Consequently many low power digital designs never perform as well as analog loops due to long pipeline delays within the loop.

There is, therefore, a need in the art for an adaptive timing technique to minimize latency in digital control loops.

SUMMARY

To address the above-discussed deficiencies of the prior art, it is a primary object of the present disclosure to provide, for use in digital control loops within power switchers and the like, a sliding error sampler analog-to-digital converter producing an error value for a digital loop iteration. A predictor variably sets the timing for initiating analog-to-digital conversion of the current error value based on the magnitude of a previous error value for a previous loop iteration, plus margins conversion housekeeping and the step size of the next loop iteration. At a timing prior to a filter reading the error value that equals the number of clock cycles set by the predictor, a timing unit triggers the analog-to-digital conversion, reducing loop latency and improving performance.

The foregoing has outlined rather broadly the features and technical advantages of the present disclosure so that those skilled in the art may better understand the detailed description that follows. Additional features and advantages of the embodiments that form the subject of the claims will be described hereinafter. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the subject matter disclosed in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 3A through 3D depict signal timing for different error magnitudes and different conditions for various implementations of a sliding error sampler analog-to-digital converter, while

FIG. 4 depicts signal timing with improved latency using a sliding error sampler while

DETAILED DESCRIPTION

FIGS. 1 through 7B, discussed below, and the various embodiments used to describe the principles of the present disclosure in this patent document are by way of illustration only and should not be construed in any way to limit the scope of the claims. Those skilled in the art will understand that the principles of the present disclosure may be implemented in any suitably arranged device.

Figure 1:
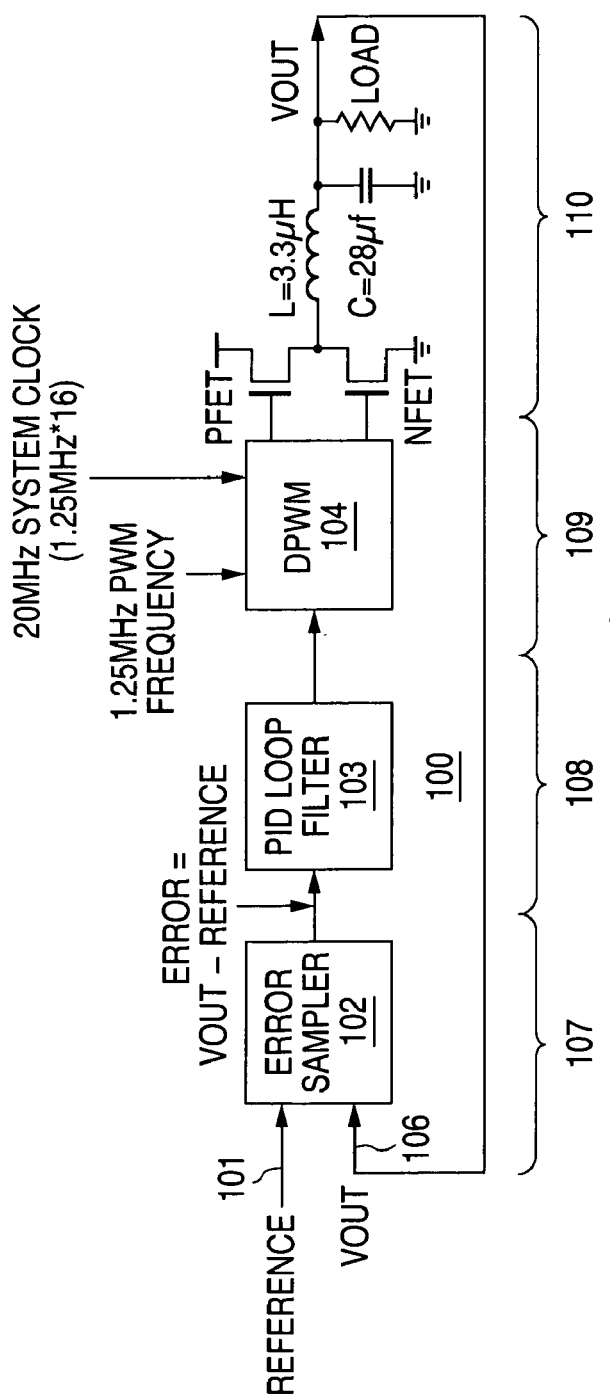
FIG. 1 is a high level block diagram of an exemplary digital power switcher within which a sliding error sampler control loop is implemented according to one embodiment of the present disclosure.

FIG. 1 is a high level block diagram of an exemplary digital power switcher within which a sliding error sampler control loop is implemented according to one embodiment of the present disclosure. The Sliding Error Sampler (SES) architecture applies adaptive timing techniques to minimize the latency in digital loops. A digital power switcher loop 100 within a switching power supply is employed to illustrate the SES architecture, but the architecture is also effective in other digital control loop applications that can tolerate a variable conversion time analog-to-digital controller (ADC) and/or a variable time output device. As noted above, other examples of digital control loop applications include servo loops and robotic controllers.

The digital power switcher loop 100 is preferably constructed in accordance with: U.S. patent application Ser. No. 11/204,285 entitled FINE-RESOLUTION EDGE-EXTENDING PULSE WIDTH MODULATOR (FREE-PW) and filed Aug. 14, 2005; U.S. Pat. No. 7,227,476 entitled DITHER SCHEME USING PULSE-DENSITY MODULATION (DITHER PWM) and issued Jun. 5, 2007; U.S. patent application Ser. No. 11/204,284 entitled DIGITAL DEAD-TIME CONTROLLER FOR PULSE WIDTH MODULATORS and filed Aug. 14, 2005; U.S. Pat. No. 7,250,884 entitled ANALOG-TO-DIGITAL CONVERTERS FOR CONTROL LOOP APPLICATIONS and issued Jul. 31, 2007; U.S. patent application Ser. No. 11/506,189 entitled MULTIPLEXED PROPORTIONAL-INTEGRAL-DERIVATIVE FILTER ARCHITECTURE (Mux-PID) FOR CONTROL-LOOP APPLICATIONS and filed Aug. 16, 2006; and U.S. patent application Ser. No. 11/731,962 entitled GAIN CONTROL CODING WITHIN PROPORTIONAL-INTEGRAL-DERIVATIVE FILTERS FOR CONTROL-LOOP APPLICATIONS and filed Apr. 2, 2007. The content of the above-identified patent documents is incorporated herein by reference.

Those skilled in the art will recognize that a complete system is not depicted in FIG. 1 or described herein. Instead, only so much of a system including a sliding error sampler control loop as is unique to the present disclosure or necessary for an understanding of the present disclosure is depicted and described herein. The components depicted in FIG. 1 may be used to implement the corresponding components depicted and described in the related applications identified above.

The digital power switcher loop 100 illustrated includes a reference voltage input 101 received at an error sampler 102 operating on an output voltage (Vout) of the control loop 100 with the reference voltage (Reference) to produce an error signal (error=Vout−Reference) at an output thereof. The error sampler 102 is preferably implemented as a Controller-ADC error detector of the type described in the above-identified U.S. Pat. No. 7,250,884 entitled ANALOG-TO-DIGITAL CONVERTERS FOR CONTROL LOOP APPLICATIONS.

Figure 1A:
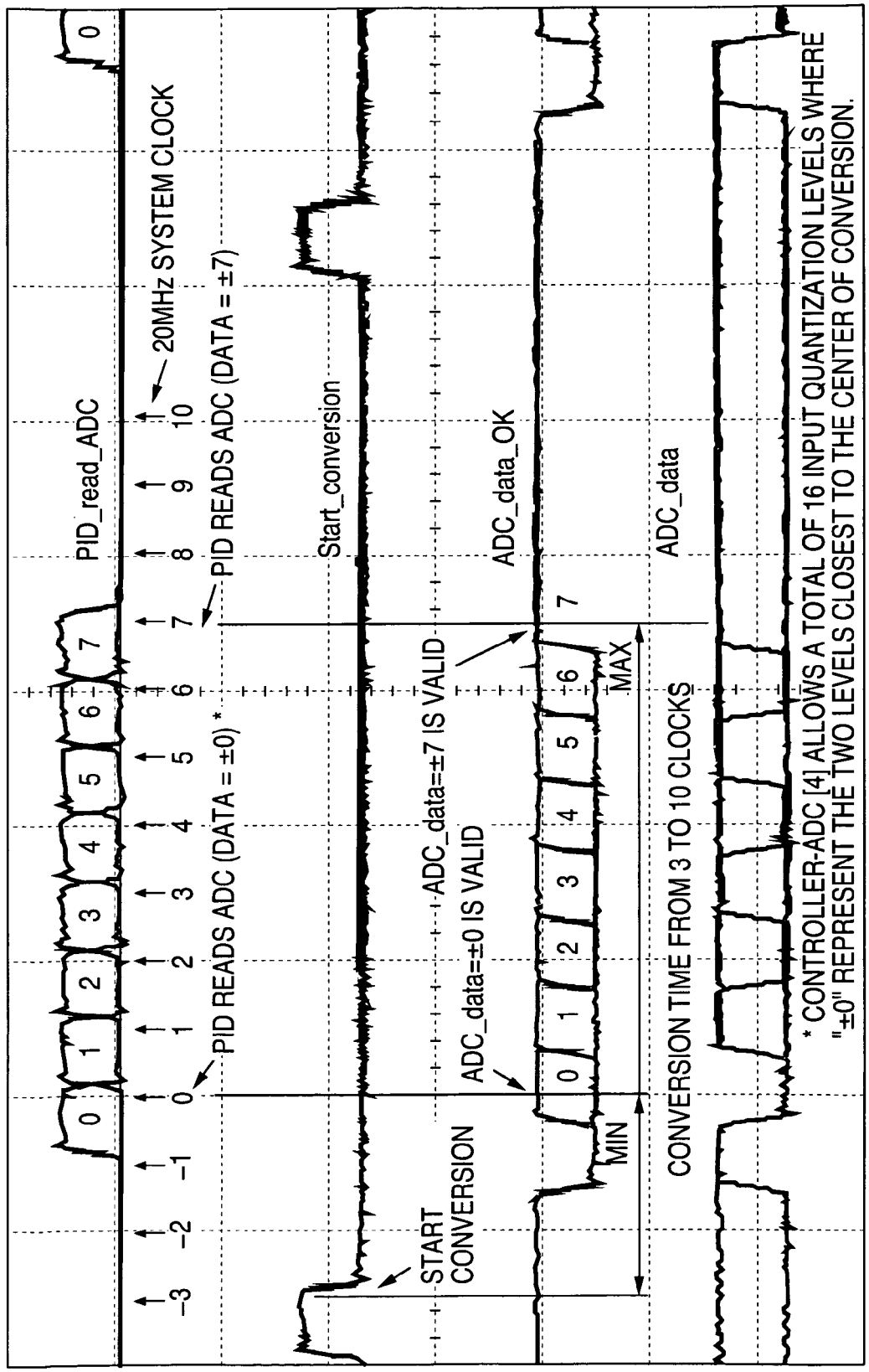
FIGS. 1A through 1D illustrate latency associated with various stages of a digital power switcher.

The latency associated with a stage 107 of digital power switcher loop 100 including such a Controller-ADC error sampler 102 is illustrated in FIG. 1A. That latency varies based upon a variable conversion time that may occupy between 3 and 10 system clock cycles in the exemplary embodiment. The top trace in FIG. 1A represents a Controller-ADC output read control signal (PID_read_ADC) superimposed on 20 mega-Hertz (MHz) system clock. The second trace from the top of FIG. 1A represents a signal (Startconversion) controlling the start of error conversion of the analog error signal derived from the control loop output voltage and the reference voltage to a digital output error signal. The third trace an output enable signal (ADC_data_OK) from the Controller-ADC error sampler 102 indicating that the output data from error sampler 102 is valid and may be read and used. The bottom trace illustrated exemplare output data for the Controller-ADC error sampler 102.

As illustrated by FIG. 1A, the Controller-ADC error sampler 102 allows for a total of 16 input error signal quantization levels corresponding to digital error signal output values ±0 (representing the two levels closest to the center of conversion) to ±7. Analog-to-digital error signal conversion time varies with the output error signal magnitude, with the smallest output error signal values (±0) requiring only 3 system clock cycles for conversion and the largest output error signal values (±7) requiring 10 system clock cycles for conversion in the exemplary embodiment.

Figure 1B:
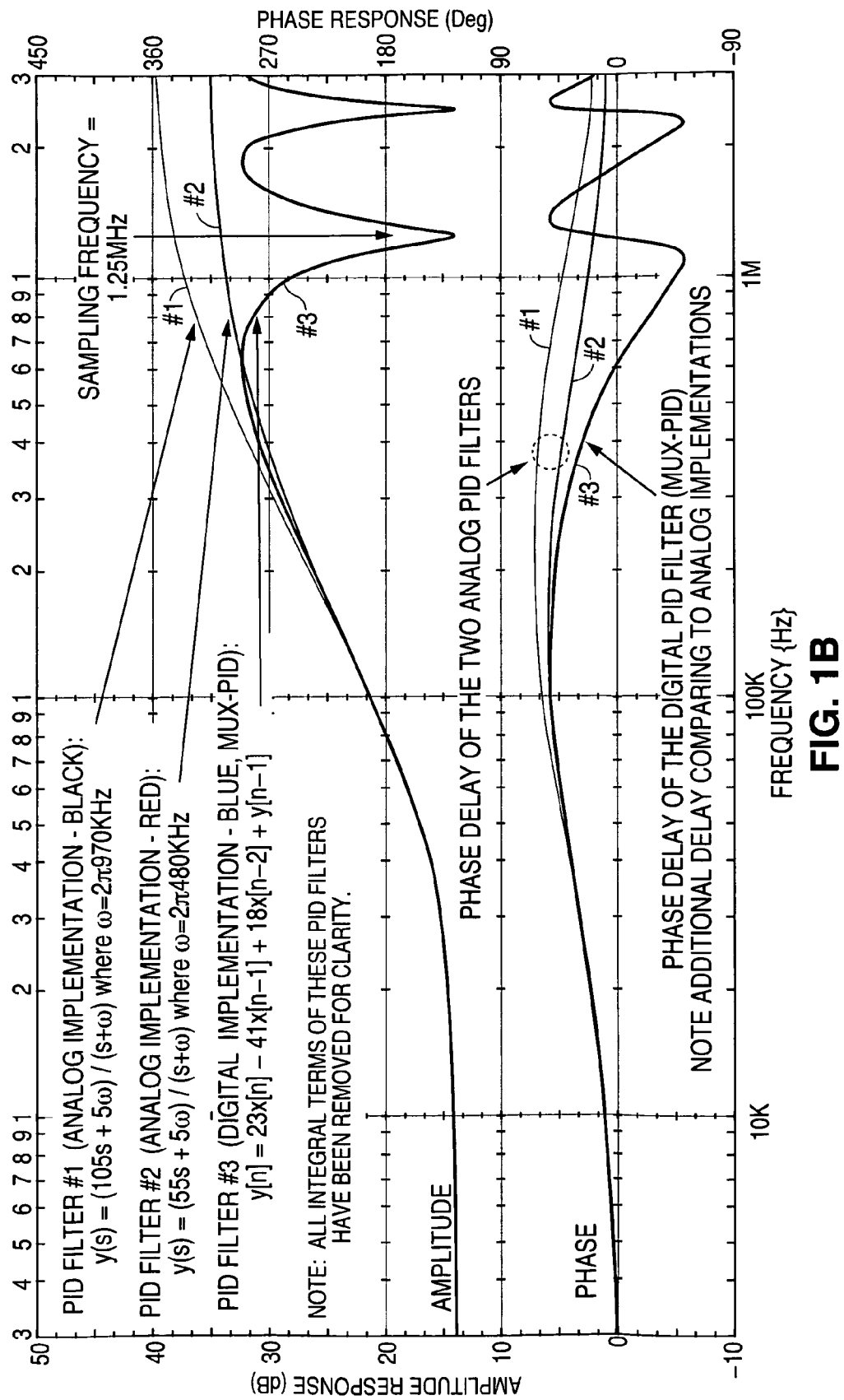

The error signal output by error sampler 102 is received by a proportional-integral-derivative (PID) loop filter 103, which is preferably implemented as described in the above-identified co-pending U.S. patent application Ser. No. 11/506,189 entitled MULTIPLEXED PROPORTIONAL-INTEGRAL-DERIVATIVE FILTER ARCHITECTURE (Mux-PID) FOR CONTROL-LOOP APPLICATIONS and Ser. No. 11/731,962 entitled GAIN CONTROL CODING WITHIN PROPORTIONAL-INTEGRAL-DERIVATIVE FILTERS FOR CONTROL-LOOP APPLICATIONS. The latency associated with various implementations of PID loop filters (neglecting integral terms) is illustrated in FIG. 1B. PID filter #1 and PID filter #2 in FIG. 1B are analog PID filters, while PID filter #3 is a Mux-PID filter as preferably implemented within stage 108 of digital power switcher loop 100. The Mux-PID filter (PID filter #3) exhibits slightly greater latency (lower amplitude and phase response) compared to the two analog PID filters (PID filter #1 and PID filter #2). The latency of Mux-PID filter within stage 108 of digital power switcher loop 100 results from PID pole delay and processing pipeline delay.

Digital power switcher loop 100 includes, within stage 109, a digital pulse width modulator (DPWM) 104 connected to the output of PID filter 103 and preferably implemented as described in the above-identified co-pending U.S. patent application Ser. No. 11/204,285 entitled FINE-RESOLUTION EDGE-EXTENDING PULSE WIDTH MODULATOR (FREE-PW), U.S. Pat. No. 7,227,476 entitled DITHER SCHEME USING PULSE-DENSITY MODULATION (DITHER PWM), and U.S. patent application Ser. No. 11/204,284 entitled DIGITAL DEAD-TIME CONTROLLER FOR PULSE WIDTH MODULATORS. The latency associated with such a digital pulse width modulator 104 varies based upon a variable time from pulse width modulation loading to the trailing edge of pulse width modulation output.

Figure 1C:
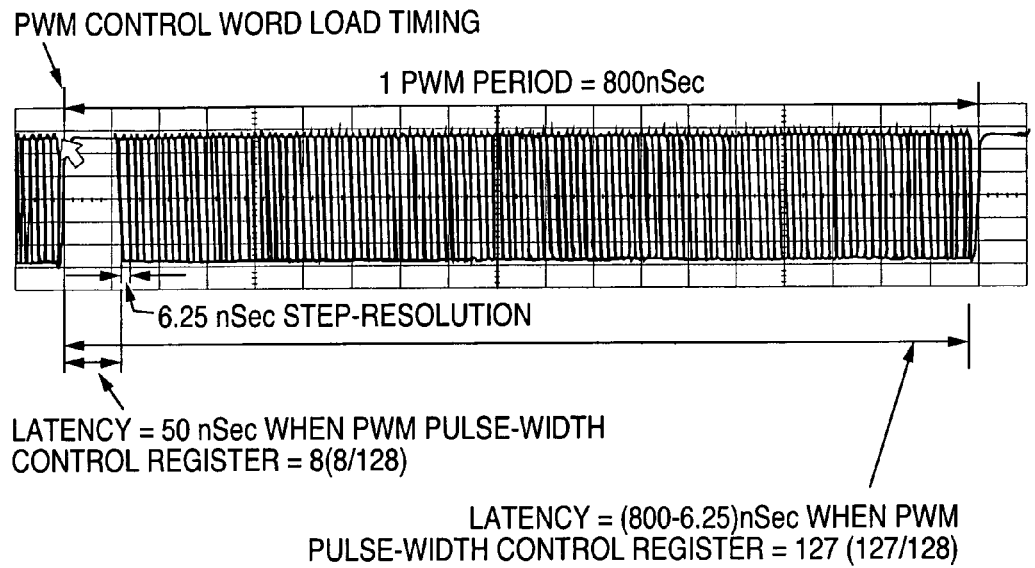

As illustrated by the overlaid traces in FIG. 1C, the exemplary embodiment has a step-resolution of 6.25 nanoseconds (ns) within a pulse width modulation period of 800 ns, with a total pulse width modulation output latency range after loading of the PWM control word of 50 ns when the PWM pulse-width control register has a value of the minimum period 8/129 and a total pulse width modulation output range of (800−6.25) ns when the PWM pulse-width control register has a value of the maximum period 127/128.

Figure 1D:
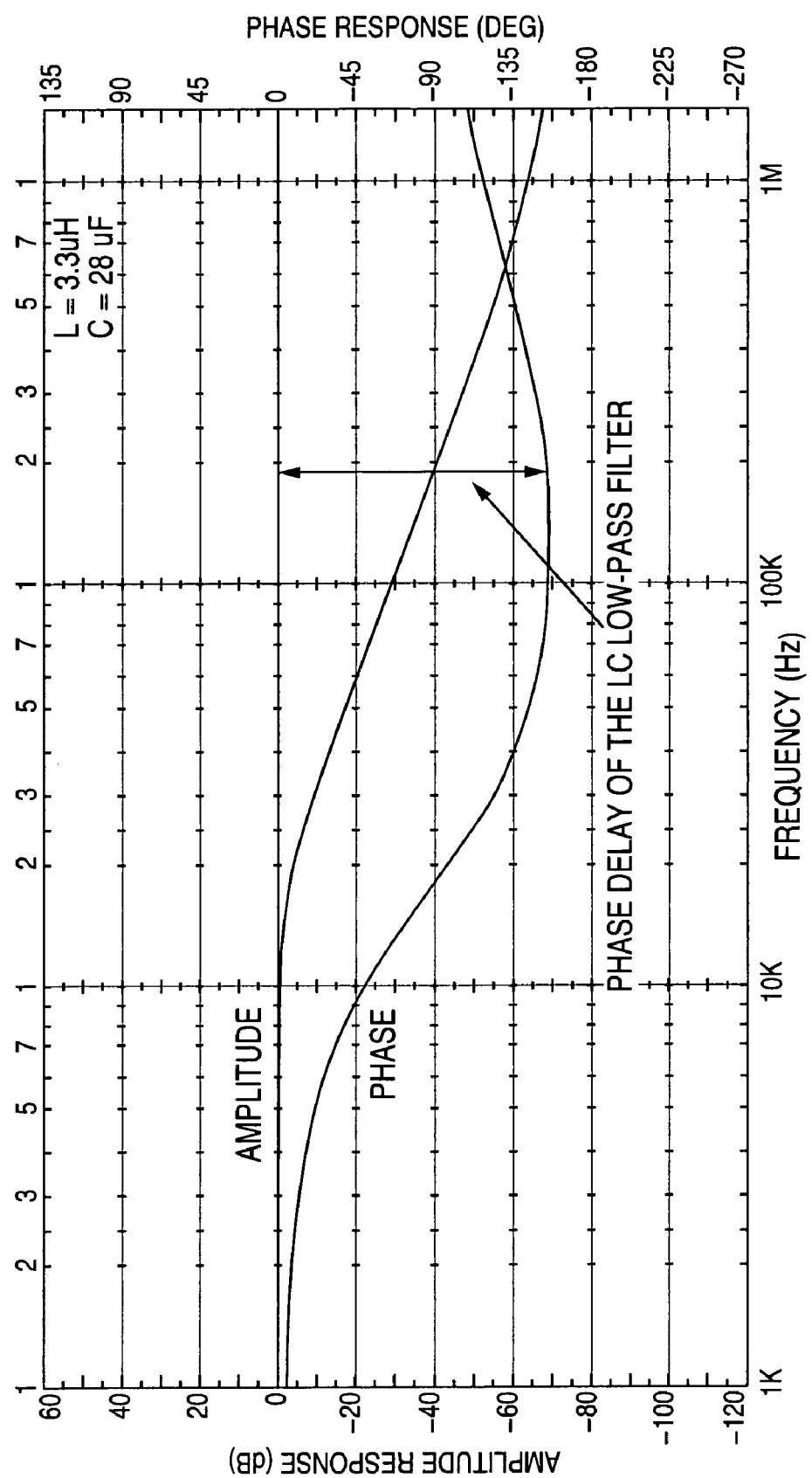

The digital power switcher loop 100 includes an output stage 110 with switching transistors PFET and NFET and an LC filter formed by inductor, a capacitor and a load. The latency (amplitude and phase response) associated with an exemplary embodiment of the output stage 110 is illustrated in FIG. 1D. The latency of the LC filter is normally a primary result of two-pole low-pass filter delay, although the latency may also be impacted by other system variables such as dead time, switching time, the resistance of the switching transistors PFET and NFET, the effective series resistance (ESR) of the inductor, capacitor and/or load, etc.

Figure 2A:
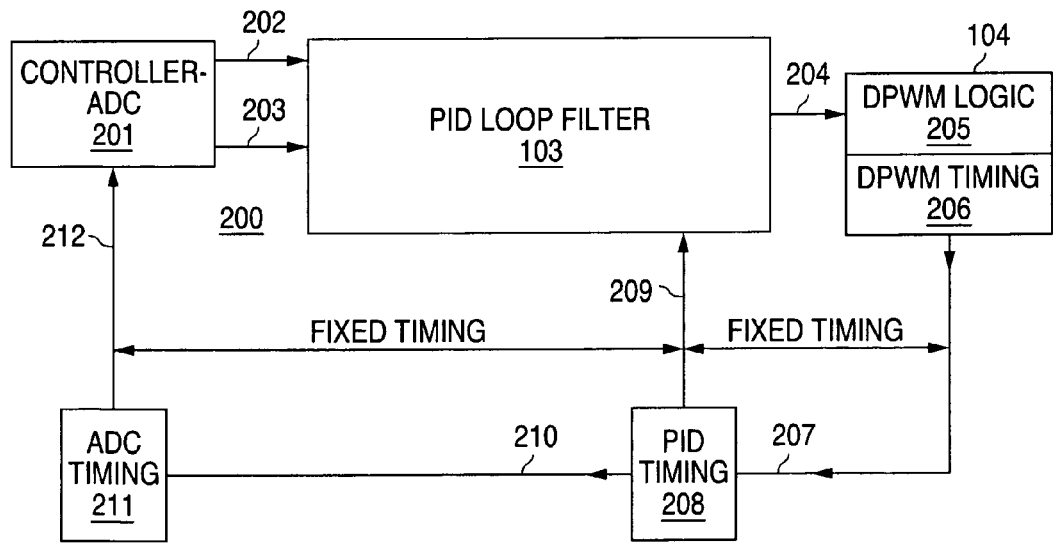
FIGS. 2A and 2B are high level block diagrams depicting additional details of a digital power switcher and comparing fixed loop timing with adaptive loop timing when a sliding error sampler control loop is implemented according to one embodiment of the present disclosure.
Figure 2B:
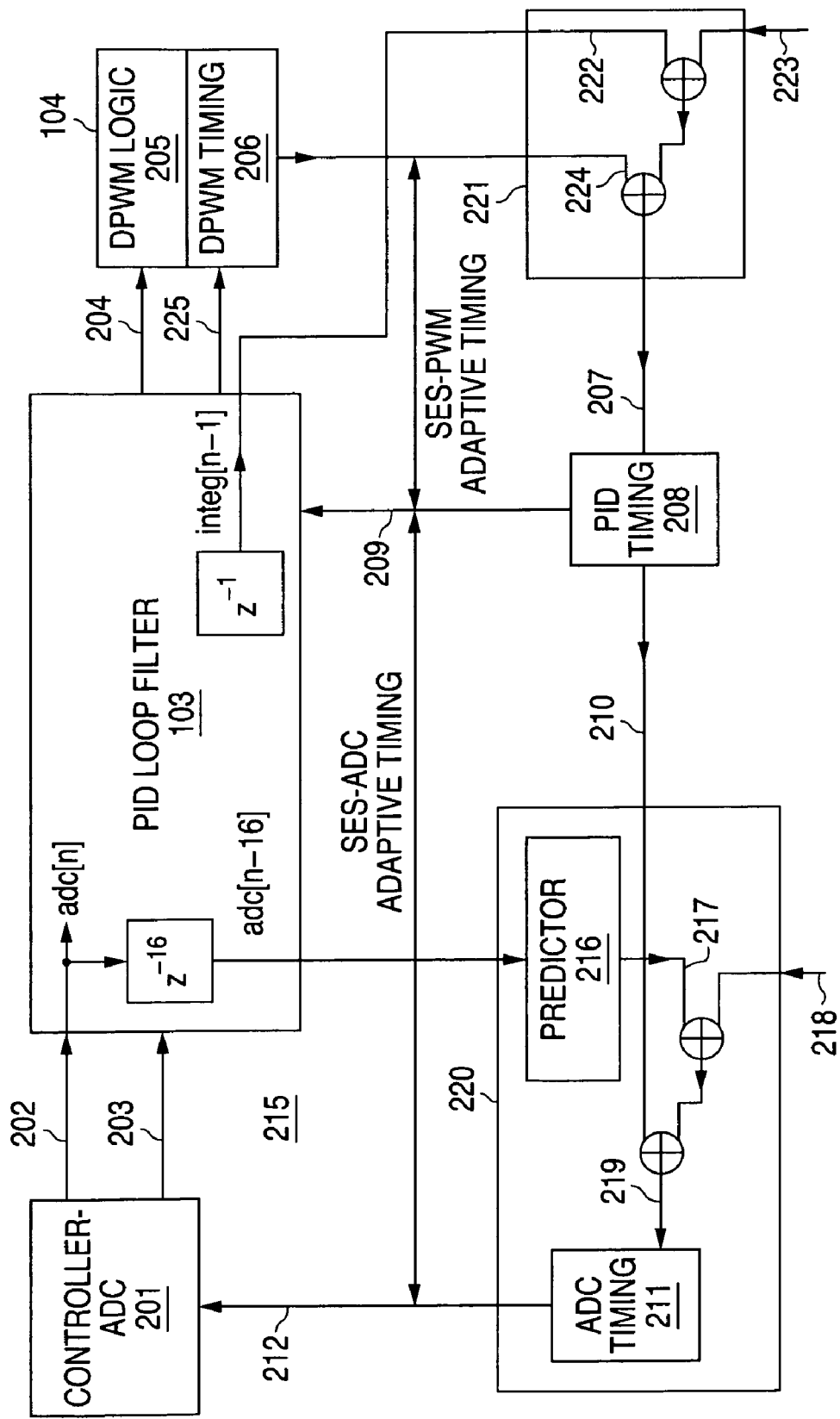

FIGS. 2A and 2B are high level block diagrams depicting additional details of a digital power switcher and comparing fixed loop timing with adaptive loop timing when a sliding error sampler control loop is implemented according to one embodiment of the present disclosure. As with FIG. 1, the entire structure is not depicted and described. In addition, some signals and structures not shown in FIG. 1 are illustrated in FIGS. 2A and 2B, and vice versa.

The portion 200 of a digital control loop illustrated in FIG. 2A includes a Controller-ADC 201 (within the error sampler 102 of FIG. 1, as described above), which generates a data value signal 202 (e.g., "ADC_data" in the exemplary embodiments) and a data valid or data enable signal 203 (e.g., "ADC_data_OK" in the exemplary embodiment), both to PID loop filter 103. PID loop filter 103, in turn, outputs a pulse width control signal 204 (e.g., "PWM pulse width control" in the exemplary embodiment) to the digital pulse width modulator 104. Digital pulse width modulator 104 includes logic 205 and timing 206 portions therein.

Loop latency in a digital control loop is the sum of all of the latencies of the loop components. System timing is required to sequentially time the loop components. In switcher designs, timing usually starts with the digital pulse width modulator. A synchronization signal 207 (e.g., "Sync_PID" in the exemplary embodiment) output by the digital pulse width modulator timing portion 206 synchronizes the PID timing state machine 208 for setting the operating states of the PID loop filter 103 using a control signal 209 (e.g., "PID mux-state" in the exemplary embodiment). Subsequently, forwarding of another synchronization signal 210 (e.g., "Sync_ADC" in the exemplary embodiment) from the PID timing state machine 208 to an ADC timing state machine 211 is triggered. The ADC timing state machine 211 generates a control signal 212 (e.g., "Start conversion") that is transmitted to Controller-ADC 201 to initiate an error signal analog-to-digital conversion and feedback control cycle. The embodiment depicted in FIG. 2A employs non-adaptive timing such that the latency from assertion of the "Start conversion" signal 212 to the digital pulse width modulator timing event (e.g., the timing of the pulse-width control word load by DWPM 104) is fixed.

The Sliding-Error-Sampler (SES) embodiment of FIG. 2B employs two adaptive functions: the SES-ADC and the SES-PWM, where each of the two functions shifts the timing of either the Controller-ADC 201 or the PID loop filter 103, respectively, toward the PWM output edge to minimize loop latency. The two functions are independent and may be used jointly or separately, although FIG. 2B illustrates both functions implemented together in a single digital control loop portion 215.

The Controller-ADC 201 outputs a value of ±0 when the input voltage received (i.e., the error signal representing the difference between the output voltage Vout and the reference voltage Reference) is near the center of conversion, and rails to an output value of ±7 when the input voltage exceeds the plus-or-minus full scale voltage of the Controller-ADC 201. During quiescent conditions, the Controller-ADC 201 hunts back and forth between the two ±0 output states, which require a short conversion time because the input voltage levels are closest to the center of conversion for the Controller-ADC 201. During transient conditions, the Controller-ADC 201 outputs high values (e.g., ±1 to ±7, where the input voltage is away from the center of conversion), which states require a longer conversion time.

The variable conversion time property of the sliding error sampler for a Controller-ADC (SES-ADC) allows latency to be shortened. The SES-ADC includes a transfer function ($z^{-16}$ in the exemplary embodiment) that stores (latches) the Controller-ADC output value (adc[n−16]) from the previous conversion cycle for use in selecting an appropriate delay. The SES-ADC applies the previous conversion cycle Controller-ADC output state value, ignoring the sign (i.e., 0 to 7), to delay the timing of the next assertion of the "Start conversion" signal. The value "0" adds the maximum delay while the value "7" retains the original timing without adding any delay. The delay effectively time slides the complete "ADC sampling and conversion process" towards the "PID read ADC" time. As a result, the latency for Controller-ADC 201 is shortened for states with low output values for Controller-ADC 201 (e.g., ±0, ±1, ... ). When the input to Controller-ADC 201 is away from the center of conversion (e.g., ... ±6, ±7), the Controller-ADC 201 operates with the maximum latency (i.e., no time sliding) or slightly less than the maximum latency.

Thus the portion 215 of the digital control loop implemented with the SES-ADC includes a predictor 216 that sets the timing of the "Start conversion" signal by taking the adc[n] value of the previous ADC conversion cycle/loop iteration (i.e., adc[n−16]) and calculates the amount of sliding (i.e., "SES-ADC-slide-control" signal 217) for the current ADC conversion cycle using:

$$SES\text{-}ADC\text{-}\mathrm{slide\text{-}control}[n] = abs(adc[n-16]) + K1 + K2 \quad (1)$$

where K1 adds latency to offset the housekeeping cycles of the Controller-ADC 201 (for which a value of 3 clock cycles is adequate for the exemplary embodiment) and K2 represents an increment margin allocating additional margin (2 clock cycles in the exemplary embodiment) for the next conversion cycle. The adding process of K1 and K2 to adc[n−16] must have a saturation function (e.g., 10 clock cycles maximum for the exemplary embodiment) to prevent wrap-around during overflow.

The margin K2 of 2 clock cycles allows the Controller-ADC 201 input to have a maximum 2-step change (increment or decrement) from one conversion cycle to the next—that is, for instance, from a value of "−5" to "−7" or from a value of "5" to "7." In actual practice, large steps—such as changes from a value of "−4" in one ADC conversion cycle to a value of "−7" in the next subsequent ADC conversion cycle—have extremely low probability of occurrence because the low-pass LC filter limits the step increment (or input slew-rate).

As apparent from comparison of FIG. 2B with FIG. 2A, the SES-ADC includes a first adder within a functional unit 220 that adds the SES-ADC-slide-control[n] signal value to a control signal 218 from control registers for adding a static phase offset and/or enabling test access. The output of the first adder is received by a second adder within functional unit 220, together with the Sync_ADC signal 210, to generate the Shift ADC timing signal 219 used by ADC timing state machine 211 to trigger the Start conversion signal 212.

Figure 3B:
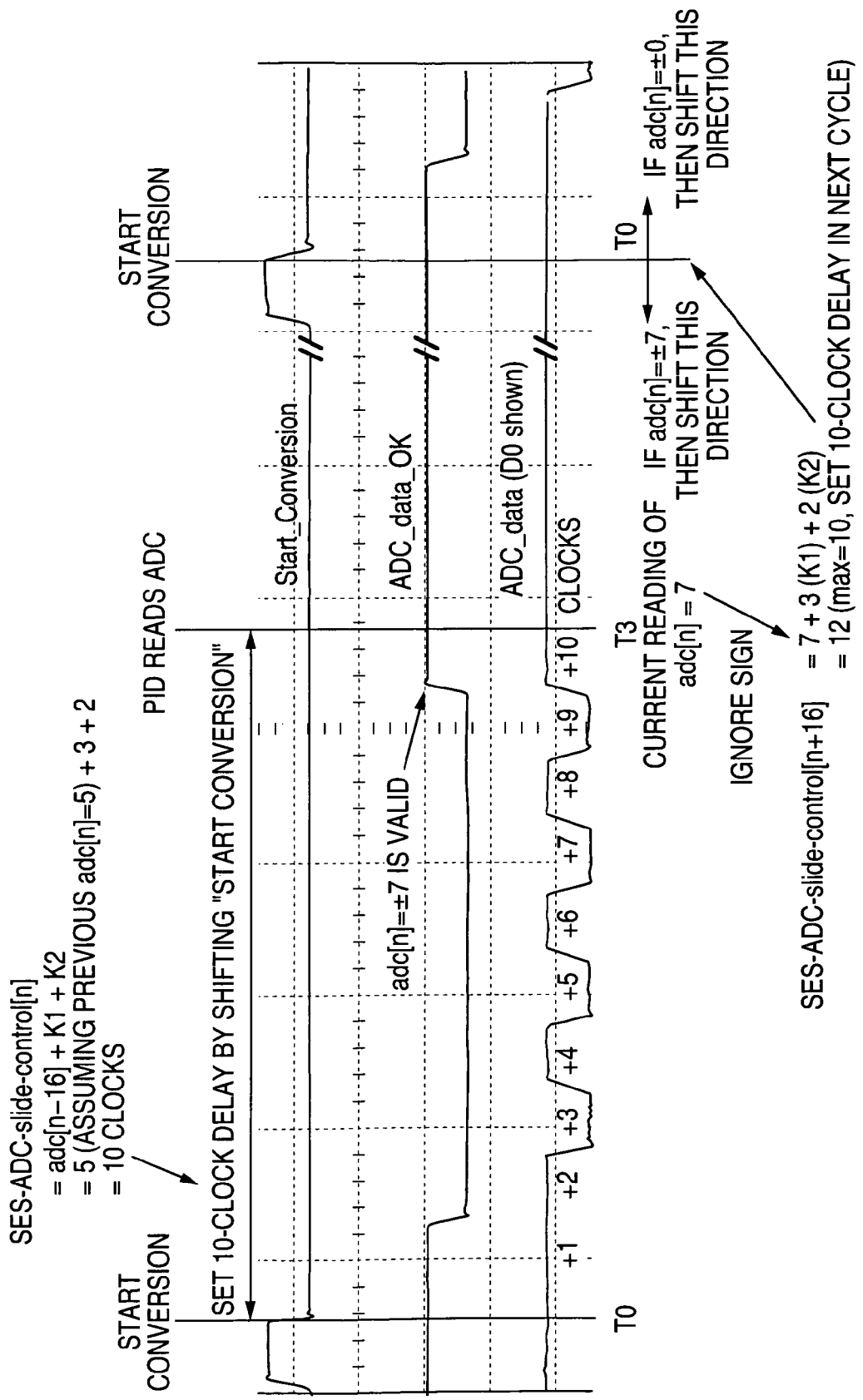

FIGS. 3A and 3B illustrate timing for a sliding error sampler Controller-ADC in accordance with one embodiment of the present disclosure. In FIG. 3A, which depicts the responses of predictor 216 for adc[n]=±0, a value from the previous conversion cycle of adc[n]=0 (ignoring sign) is assumed. The value of SES-ADC-slide-control[n] will thus be 5 clock cycles, so a 5 clock cycle delay is set by shifting assertion (leftmost time "T0") of the "Start conversion" signal (top trace) relative to the PID reads ADC signal (time "T3"). The ADC_data_OK signal (middle trace) is asserted at the end of the second clock cycle following time T0 to indicate that the current adc[n] value of "0" is valid, and at time T3 that value (i.e., adc[n+16]) becomes the current reading of adc[n] and is used in selecting the delay for the next conversion cycle (rightmost time "T0"). In FIG. 3B, which depicts the responses of predictor 216 for adc[n]=±7, a value from the previous conversion cycle of adc[n]=5 (ignoring sign) is assumed. The value of SES-ADC-slide-control[n] will thus be 10 clock cycles, so a 10 clock cycle delay is set by shifting assertion (leftmost time "T0") of the "Start conversion" signal (top trace) relative to the PID reads ADC signal (time "T3"). The ADC_data_OK signal (middle trace) is asserted at the end of the ninth clock cycle following time T0 indicate that the current adc[n] value of "7" is valid, and at time T3 that value (i.e., adc[n+16]) becomes the current reading of adc[n] and is used in selecting the delay for the next conversion cycle (rightmost time "T0"). Since the maximum delay is 10 clock cycles, a 10 clock cycle delay will be set for the Start conversion signal in the next conversion cycle.

In one variant of the SES-ADC, the K2 selection takes the input slew-rate into consideration. A low value affects the large-step handling capability. If the ADC input were allowed to slew quickly, premature read would occur, leading to erroneous data. On the other hand, a high K2 value decreases the effectiveness of the SES-ADC by providing only poor latency reduction.

Figure 3C:
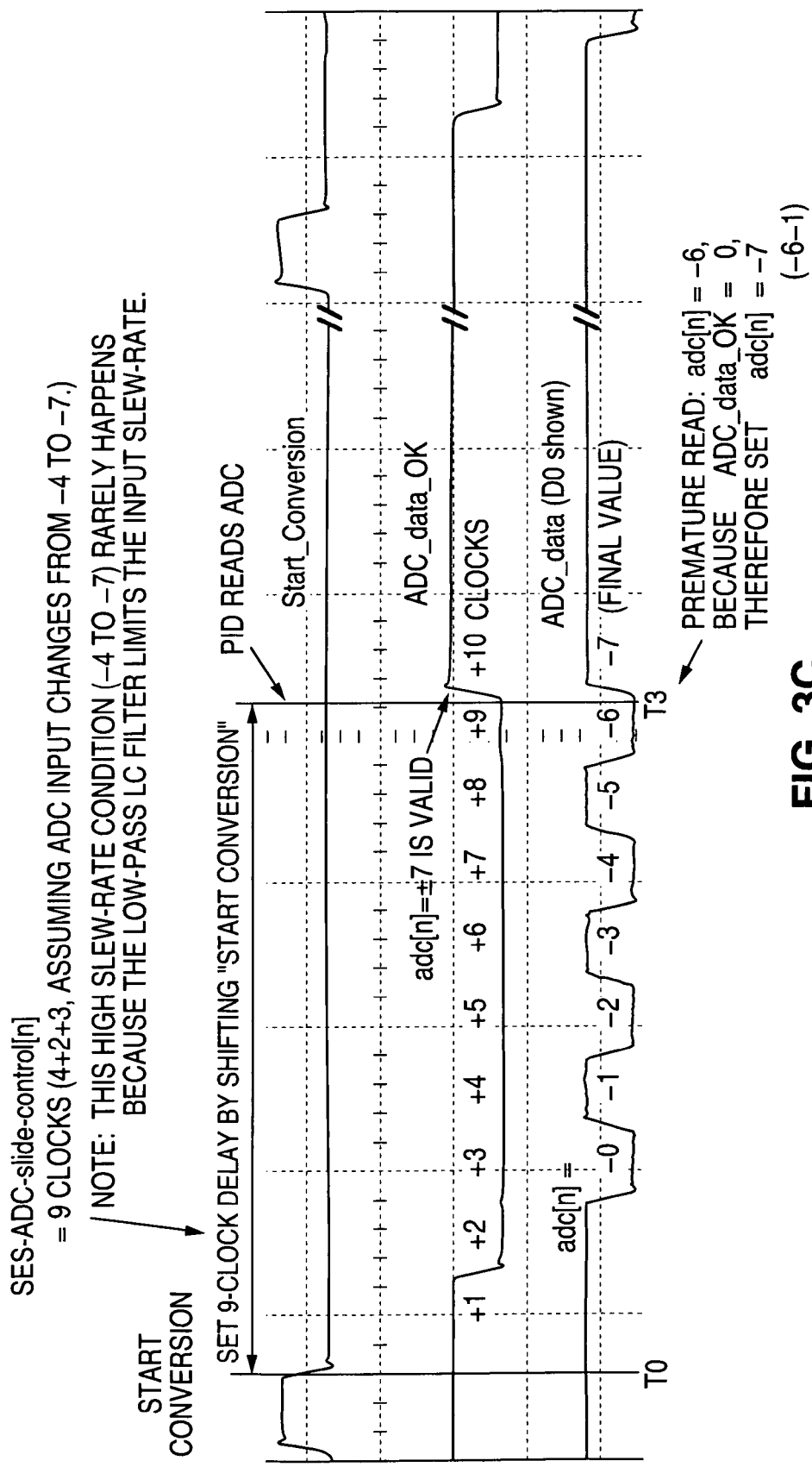

FIG. 3C illustrates responses for one possible SES-ADC coding for high slew-rate signals that allows premature reads one clock before the ADC output is ready. In the example shown, the adc[n] value is assumed to transition from a value of "−4" in one conversion cycle to a value of "−7" in the next conversion cycle. The algorithm is designed to output −0 to −7 sequentially (or 0 to 7 if the input is positive). The output should stop and stay at the final value at the end of conversion, such that the final value (ignoring sign) can be any value from 0 to 7. The ADC_data_OK signal is asserted (set to 1) at the end of conversion. If the value of ADC_data_OK is zero when reading adc[n], then the absolute value of adc[n] is increased by 1.

The algorithm requires the SES-ADC to sequentially output the partial result before the end of conversion. If there has been a premature read (i.e., the margin reserved by k2 is inadequate), then the result is corrected by adding "1" to the SES-ADC premature output. This is a cost-effective solution in reducing the K2 margin. When the input decreases from high values to low values (e.g., from −7 to −6), the K2 margin is unnecessary and wasteful but does not lead to catastrophic errors. Adding a signal differentiator "adc[n]−adc[n−16]" to predictor 216 eliminates the wasted time and enhances the effectiveness of the SES-ADC. However, empirical data shows that a simple K2=2 provides the best cost-performance compromise.

Figure 3D:
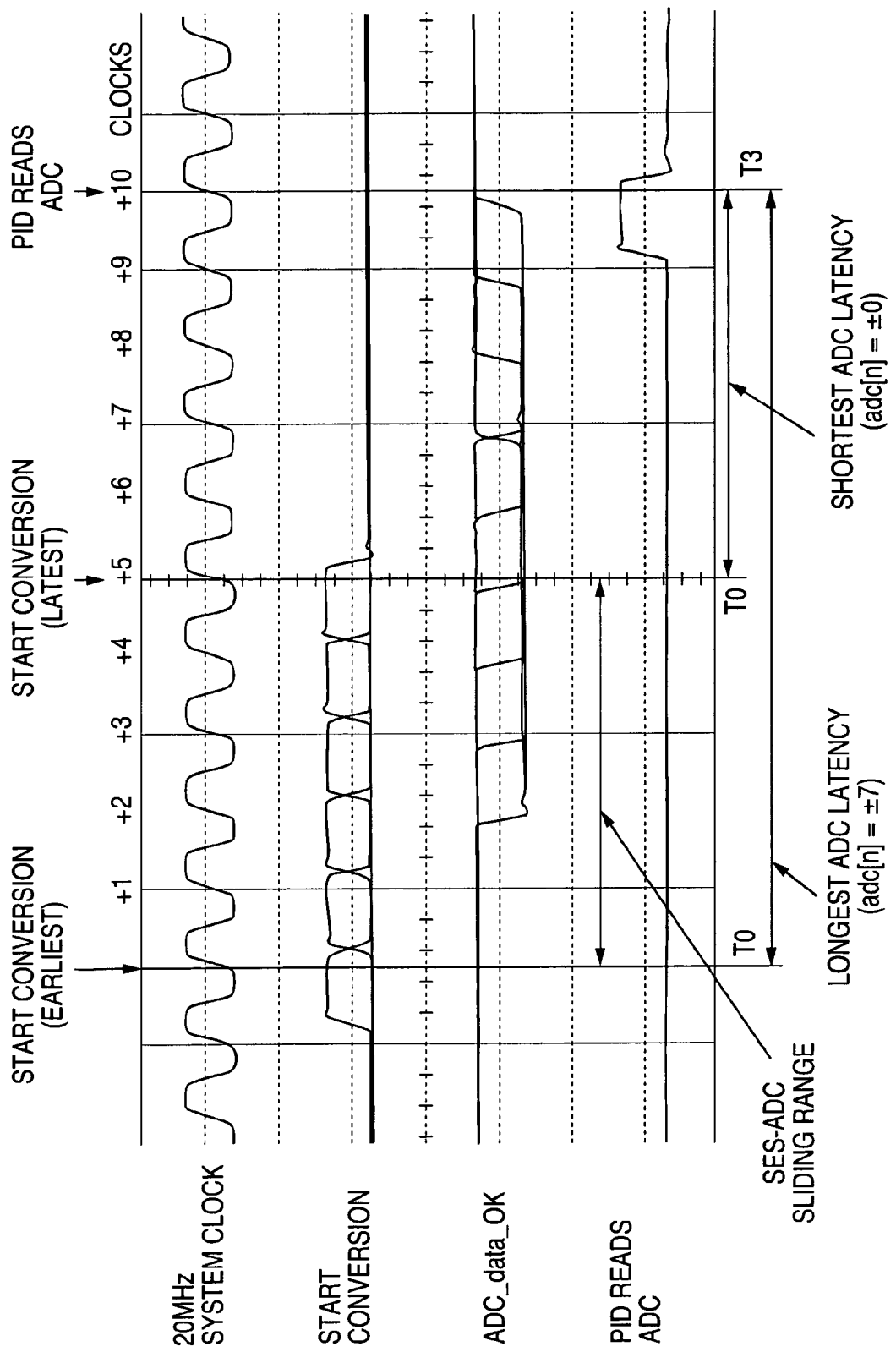

FIG. 3D illustrates the overall sliding range timing for an SES-ADC according to one embodiment of the present disclosure. Based on a 20 MHz system clock (top trace), the earliest and latest assertions of the Start conversion signal (second trace) and the ADC_data_OK signal (third trace) relative to assertion of PID reads ADC signal (bottom trace) for the shortest and longest ADC latencies.

The sliding error sampler for latency reduction in the pulse width modulator path (SES-PWM) groups the ADC and PID loop filter as one timing unit and time slides the operation toward the output trailing edge of the digital pulse width modulator so that the loop latency is minimized. In conventional switcher designs, the DPWM generates pulse-width modulated signals to control the output power transistors PFET and NFET. The DPWM pulse starts at a fixed time location, usually the DPWM control word loading time. The output trailing edge is then varied according to the control word, with the DPWM latency calculated from the time the control word is loaded (i.e., the PWM rising edge) to the time when the trailing edge returns to zero. Therefore the DPWM latency increases when the DPWM delivers long pulses. The maximum latency occurs when the pulse reaches a full PWM period, causing the phase margin of the loop to be a minimum.

Figure 3E:
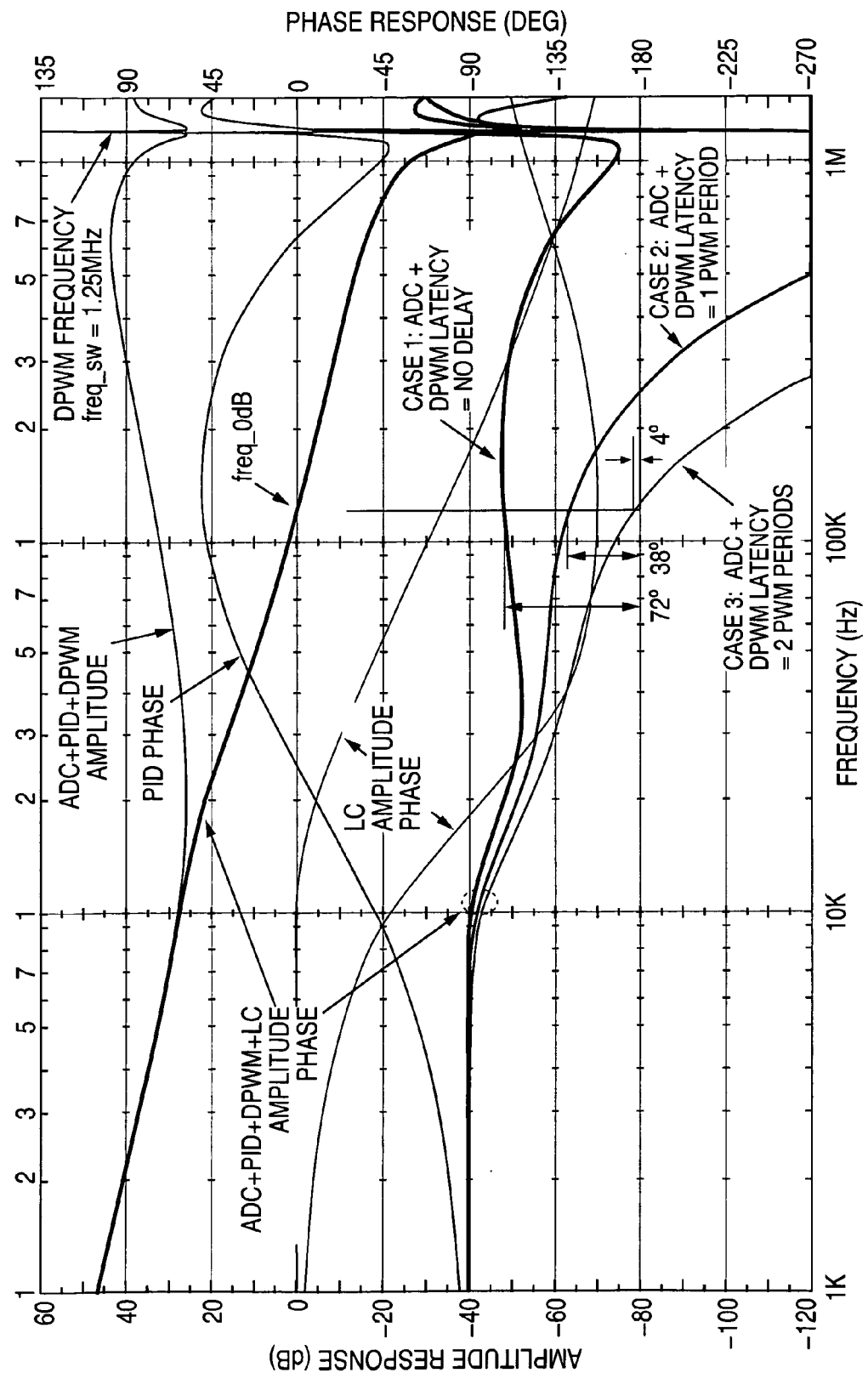
FIGS. 3E and 3F depict comparative signal response and timing for selected implementations.

The interrelation of loop latency and phase margin is illustrated by three cases in FIG. 3E. The baseline performance (case 1) of an ideal Controller-ADC and DPWM having no delay, for which the total loop (Controller-ADC 201, PID loop filter 103, DPWM 104 and LC filter output stage 110), exhibits phase shifting at 0 decibel (dB) amplitude response that is 72° from −180° phase response. The sliding error sampler architecture (case 2), which reduces latency from a nominal 2 PWM periods to 1 PWM period (although results may vary) exhibits phase shifting at 0 decibel (dB) amplitude response that is 38° from −180° phase response. When Controller-ADC and DPWM latency is 2 PWM periods (i.e., without using the sliding error sampler), phase margin degrades to 4°.

In order to increase the loop phase margin (or reduce the loop latency), the SES-PWM takes the value of integ[n−1] and time slides the ADC sampler and the PID loop filter toward the DPWM output trailing edge. The SES-PWM must group the Controller-ADC 201 and PID loop filter 103 as one timing unit before applying the time sliding. In actual practice, the Controller-ADC 201 is already "time-ganged" to PID loop filter 103 by a time-linkage that is either fixed (as in conventional designs) or adaptive (as when the SES-ADC is implemented). Sliding the timing of the PID loop filter 103 also slides the timing of the Controller-ADC 201.

In the SES-PWM, the amount of time sliding is controlled by the value of integ[n−1], the integral state variable of the PID-filtered digital control loop that stores an average value of the pulse-width of the DPWM. In short, the PWM pulse-width is zero when integ[n] is zero, while the pulse is fully on when integ[n] reaches the full-scale value. Thus the portion 215 of the digital control loop implemented with an SES-PWM includes a first adder within a functional unit 221 that receives the integ[n−1] signal from a transfer function (latch) within PID loop filter 103 as an SES-PWM-slide-control signal 222. The first adder adds the value for the SES-PWM-slide-control signal 222 to a control signal 223 from control registers for adding a static phase offset and/or enabling test access. The output of the first adder within functional unit 221 is received by a second adder within that functional unit 221, together with Sync_PID signal 224 from DPWM 104 and generates a signal for synchronizing the PID timing state machine 208.

Because of the low-pass characteristic of the integral path, the value of integ[n−1] does not exhibit abrupt jumps during transients or large load changes. Therefore this filtered signal integ[n−1] can be applied directly to control the timing of the Controller-ADC 201 and the PID loop filter 103. The SES-PWM does not require high resolution. Taking the four most-significant-bits of integ[n−1] provides a resolution of 1/16 or approximately 6% step size relative to the full pulse width modulation period, which should satisfy a majority of applications.

Figure 3F:
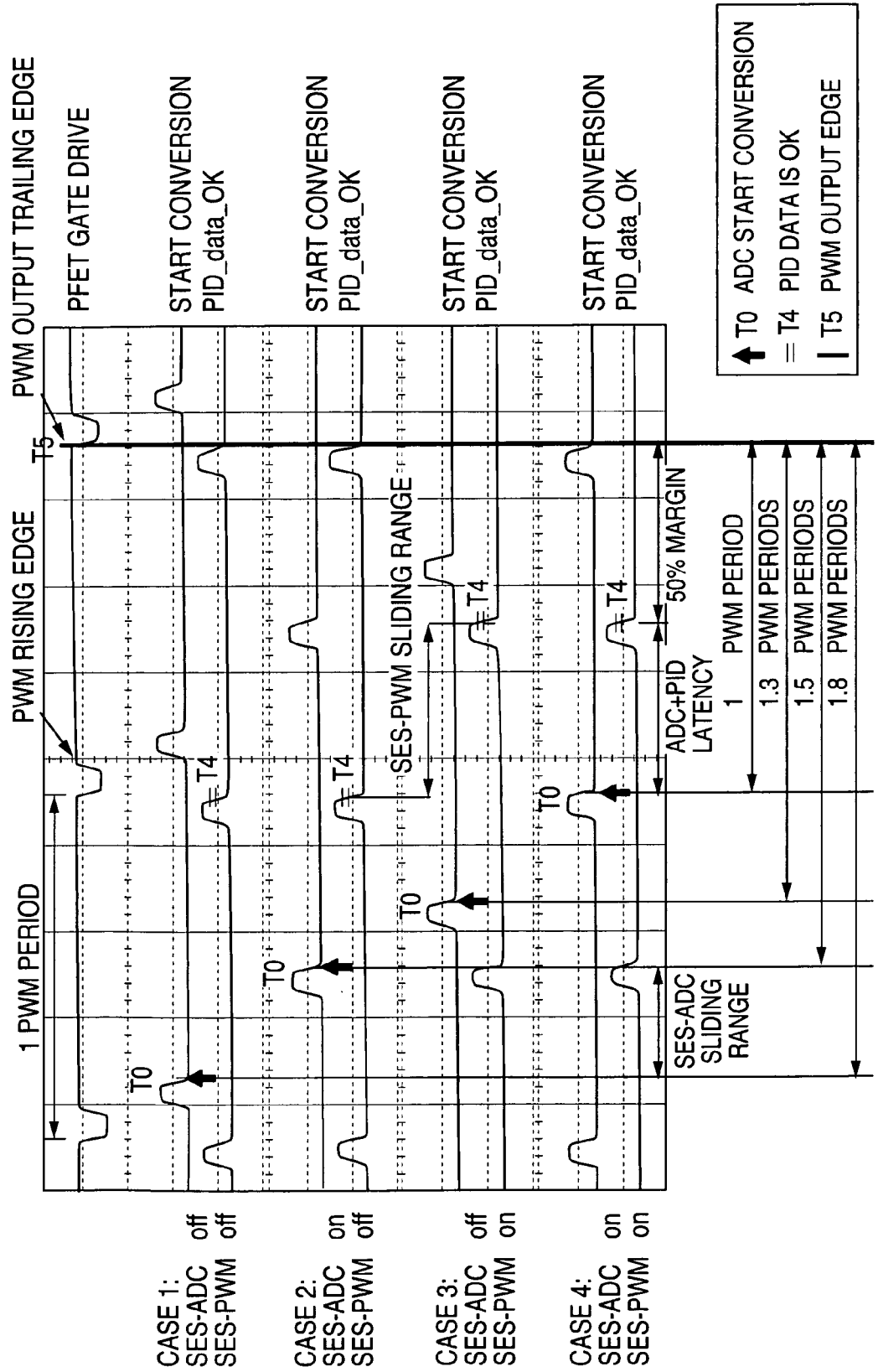

FIG. 3F illustrates timing for various implementations of a digital control loop with none, one or both of an SES-ADC and an SES-PWM. The PFET gate drive (top trace) for two PWM periods is illustrated, with the second PWM period ending at time T5 corresponding to the trailing edge of the PFET gate drive signal. The time T0 of assertion of the Start conversion signal and the time T4 of assertion of the PID_data_OK signal, both relative to time T5, are illustrated for four cases: when both the SES-ADC and the SES-PWM are turned off (case 1); when the SES-ADC is turned on but the SES-PWM is turned off (case 2); when the SES-ADC is turned off but the SES-PWM is turned on (case 3); and when both the SES-ADC and the SES-PWM are turned on (case 4). The SES-ADC sliding range is illustrated by the difference in time T0 for the first two cases, while the SES-PWM sliding range is illustrated by the difference in time T4 for the second and third cases. As illustrated, the Controller-ADC and PID loop filter is approximately half a PWM period, and a 50% margin is provided in the example shown.

Theoretically, sliding the PID_data_OK signal 225 to coincide with the output edge reduces the PWM latency to zero. However, this creates a problem of the input arriving after the output when there is a transient demanding an early output edge, which may result in a shrinking pulse or even a zero-width pulse. To handle these transient conditions, a time margin is required between the PID_data_OK signal and the PWM output edge, where a margin of 30-50% of a full PWM period works well for most designs and allows the PWM to properly time the pulse.

When the PWM pulse width is zero or near zero, the margin is unnecessary because the PWM does not have foot-room to handle any downward swing signals. The earliest timing placement of PID_data_OK (time T4) can be slightly before the PWM rising edge (similar to T4 in cases 1 and 2 of FIG. 3F). Finally, the latency improvement is shown with both SES-ADC and SES-PWM functions turned on and off. Latency is reduced by 0.8 of a PWM period when both functions are employed, which reduction varies when different margin criteria are chosen.

Figure 4:
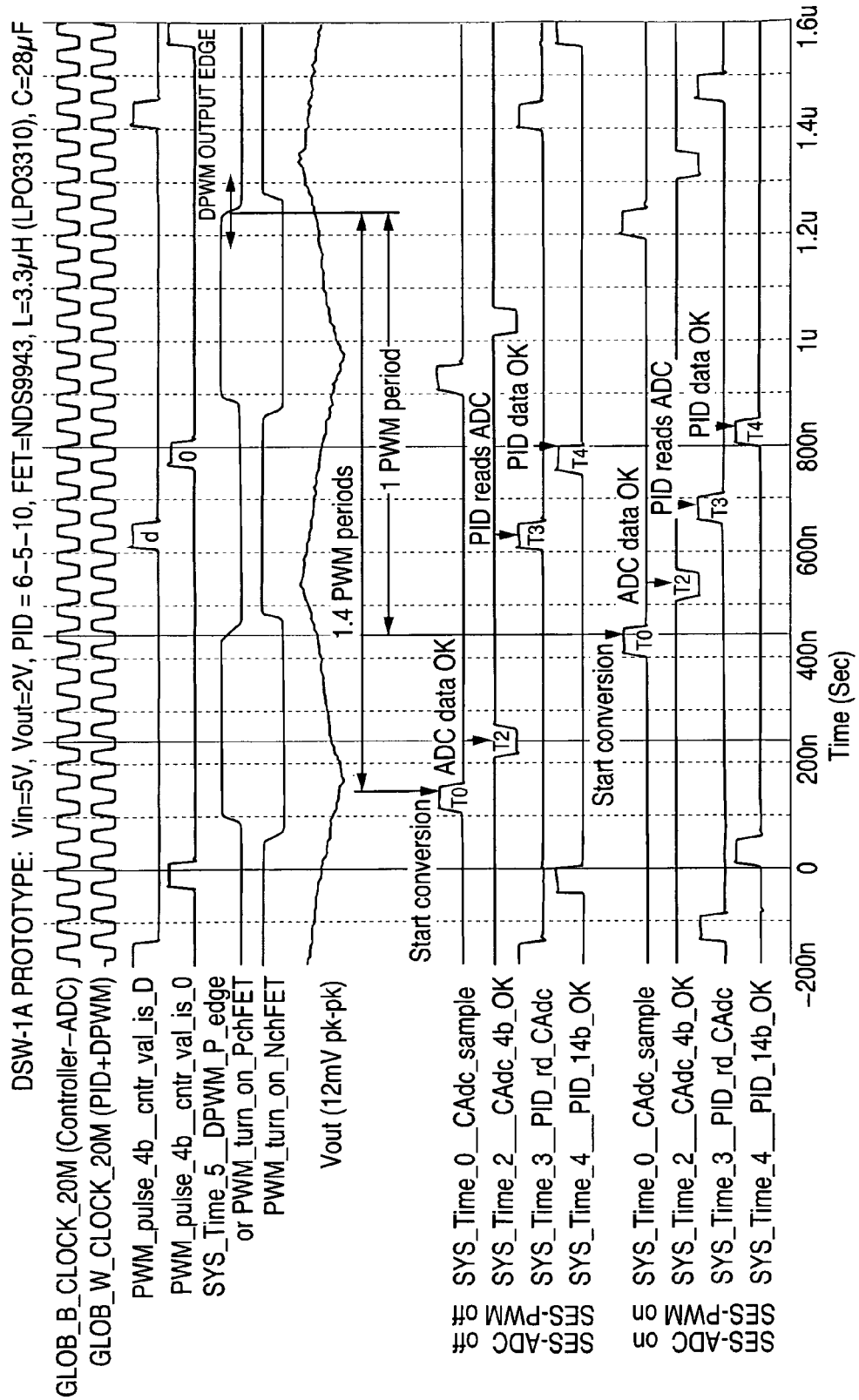

FIG. 4 illustrates the overall system timing relationship of signals within a prototype digital loop including a sliding error sampler in accordance with one embodiment of the present disclosure. The Start conversion, ADC_data_OK, PID_reads_ADC and PID_data_OK signals are plotted for implementation without the sliding error sampler activated and with the sliding error sampler activated (where implemented, the sliding error sampler may be selectively disabled). The latency from the DPWM output edge decreases from 1.4 PWM periods to 1 PWM period when the sliding error sampler is activated.

Figure 5:
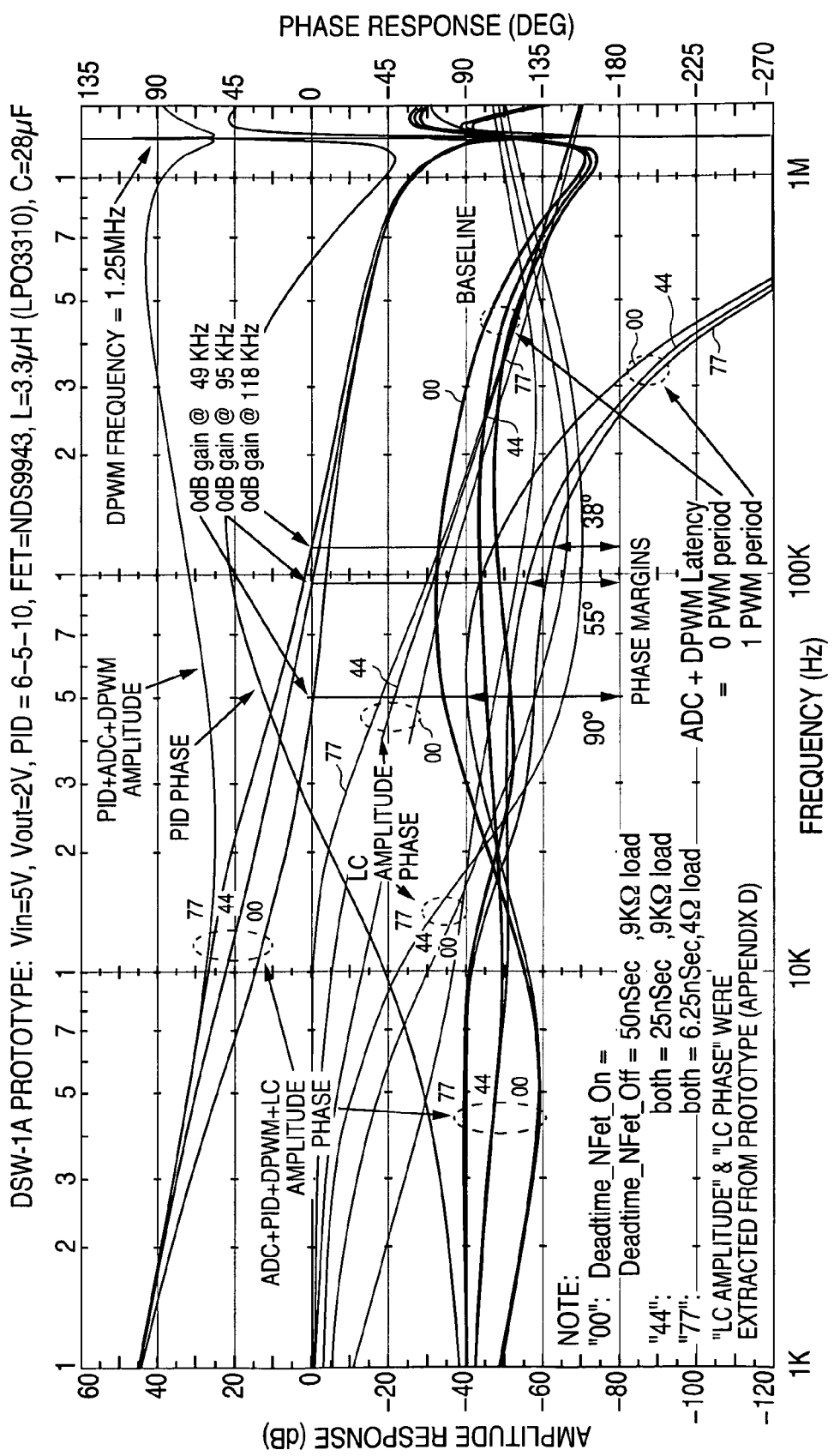
FIGS. 5 and 6A through 6C illustrate signal responses for components with a sliding error sampler analog-to-digital converter.

FIG. 5 illustrates loop latency versus dead-time and load for both: the ideal Controller-ADC and DPWM having no delay; and a Controller-ADC and DPWM implemented with a sliding error sampler to have a 1 PWM period delay in accordance with one embodiment described herein. The traces labeled "00" correspond to leading and lagging dead-time periods for the NFET of 50 ns with a 9 kilo-Ohm (KΩ) load, exhibiting 0 dB gain at 49 kilo-Hertz (KHz) with a 90° phase margin. The traces labeled "44" correspond to leading and lagging dead-time periods for the NFET of 25 ns with a 9 KΩ load, exhibiting 0 dB gain at 95 KHz with a 55° phase margin. The traces labeled "77" correspond to leading and lagging dead-time periods for the NFET of 6.25 ns with a 4Ω load, exhibiting 0 dB gain at 118 KHz with a 38° phase margin. The LC amplitude response and the LC phase response were extracted from a prototype described below. The amplitude and phase responses of the LC filter vary significantly from the settings of dead-time and load, such that the phase and gain margins also vary over a wide range.

Figure 6A:
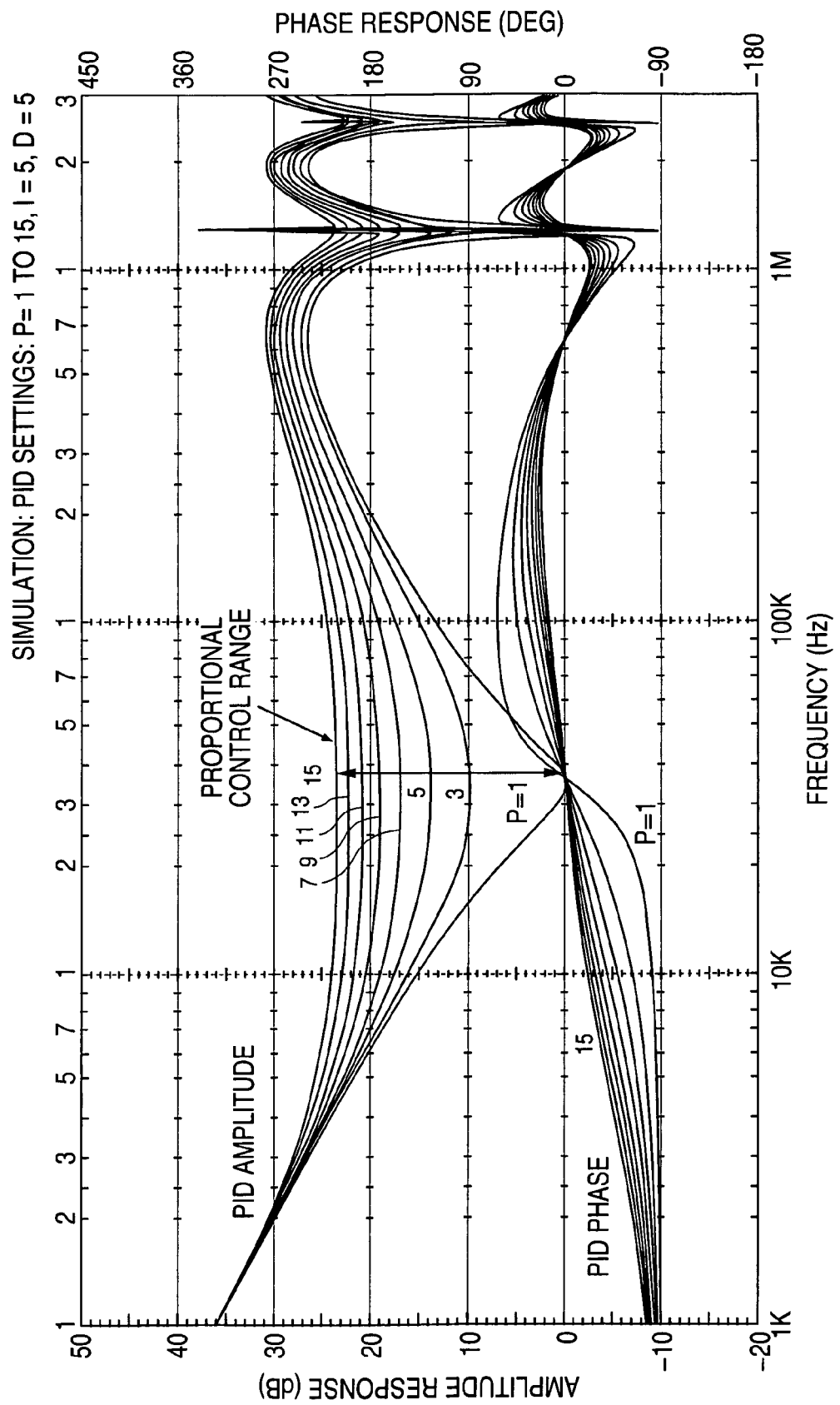
Figure 6B:
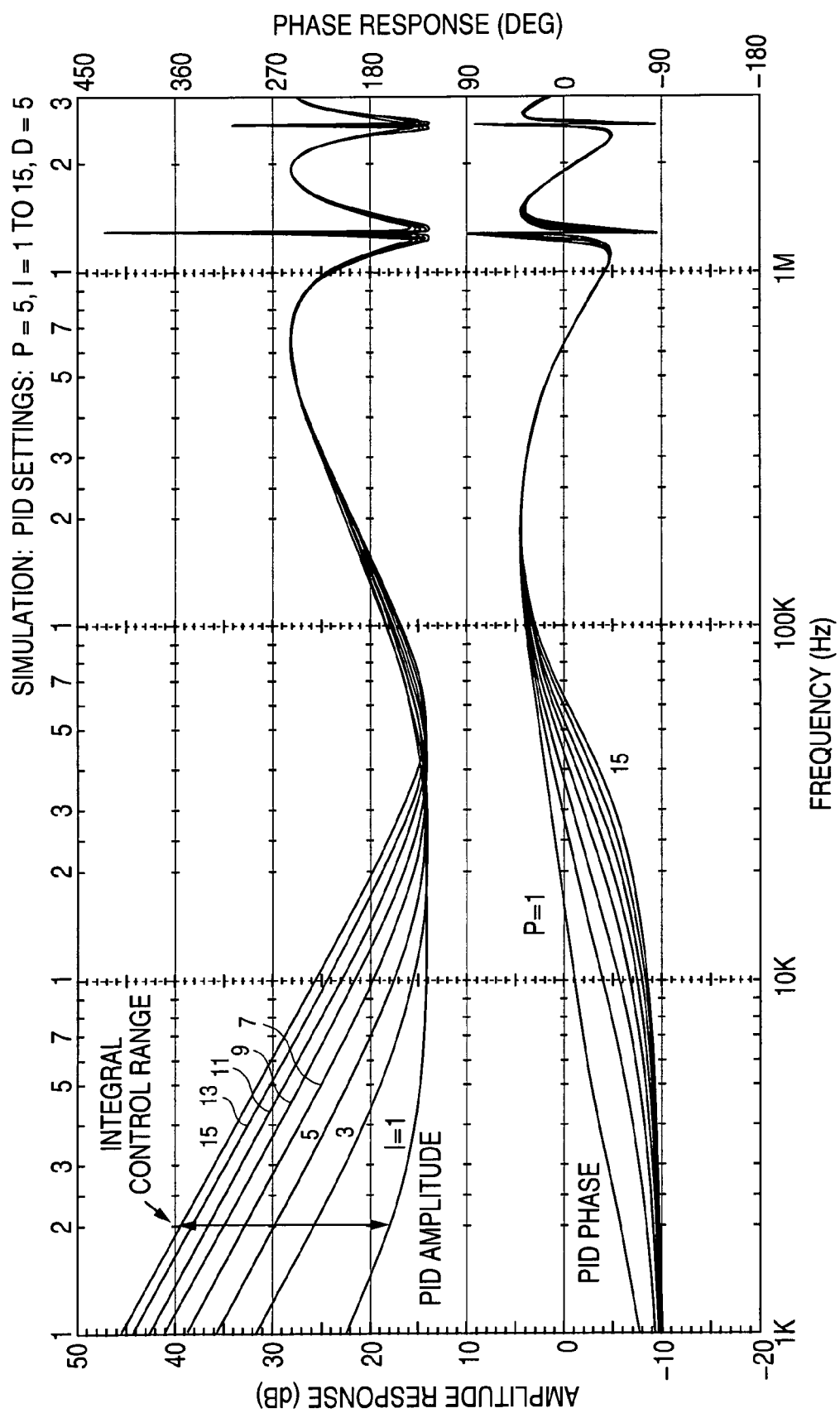
Figure 6C:
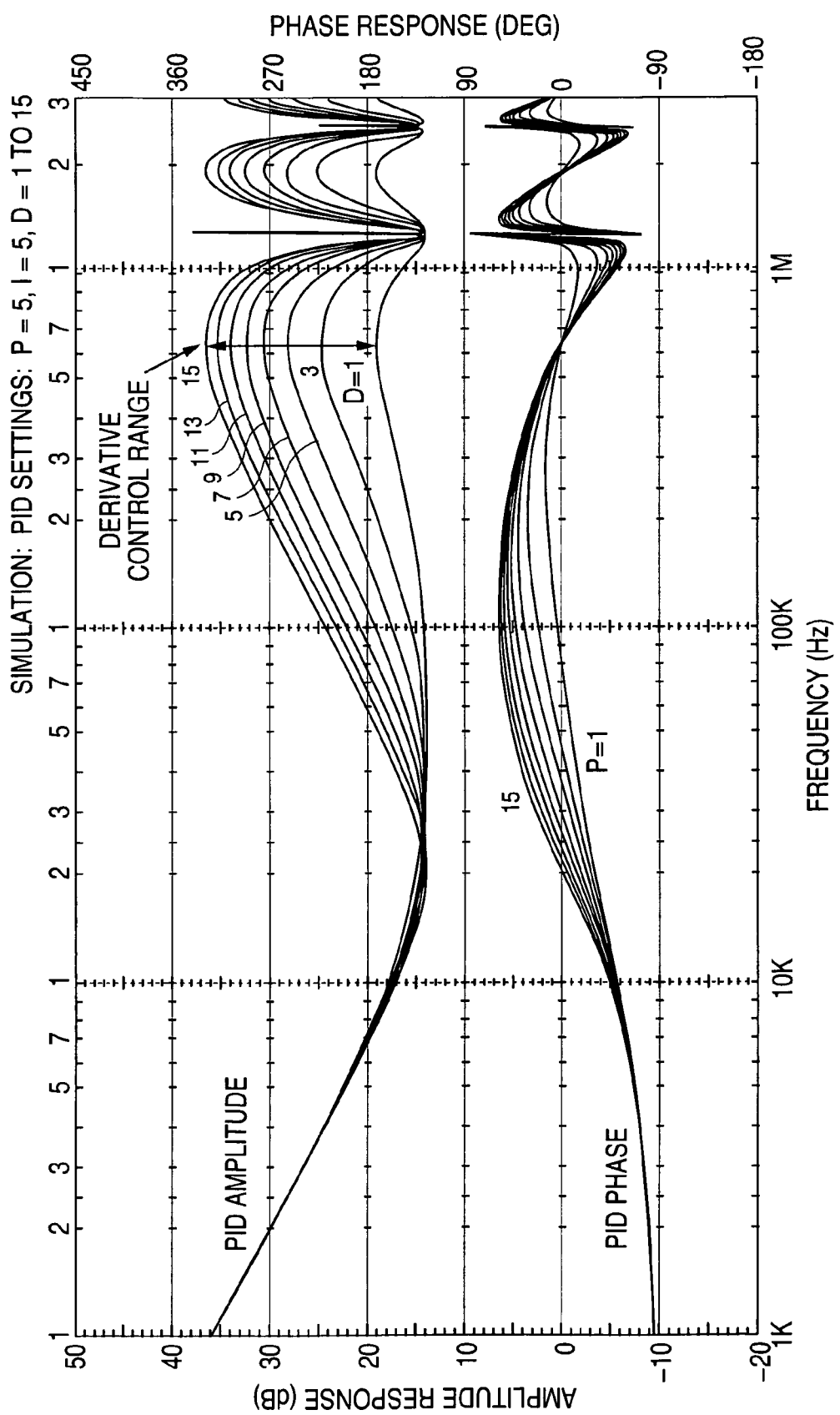

FIGS. 6A, 6B and 6C illustrate the full proportional control range, integral control range and derivative control range, respectively, for a Mux-PID loop filter within a digital loop having a sliding error sampler according to one embodiment of the present disclosure. Amplitude and phase responses with register setting P=6, I=5 and D=10 were applied for both FIG. 3E and FIG. 5.

Figure 7:
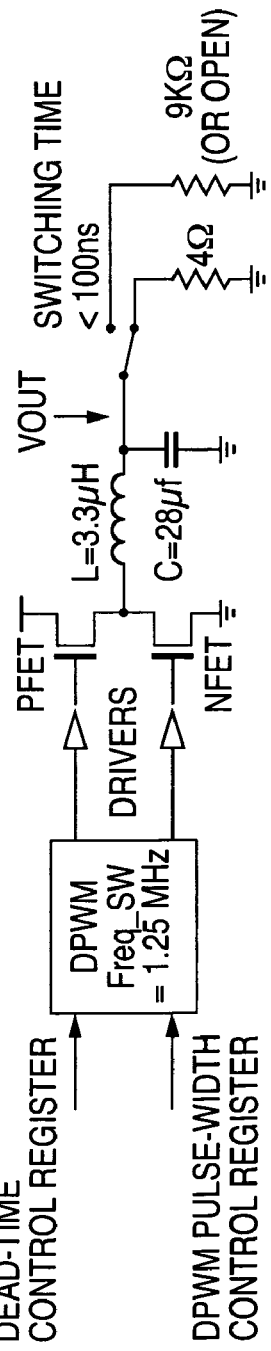
FIG. 7 depicts a test configuration for an output stage of a control loop including a sliding error sampler analog-to-digital converter.
Figure 7A:
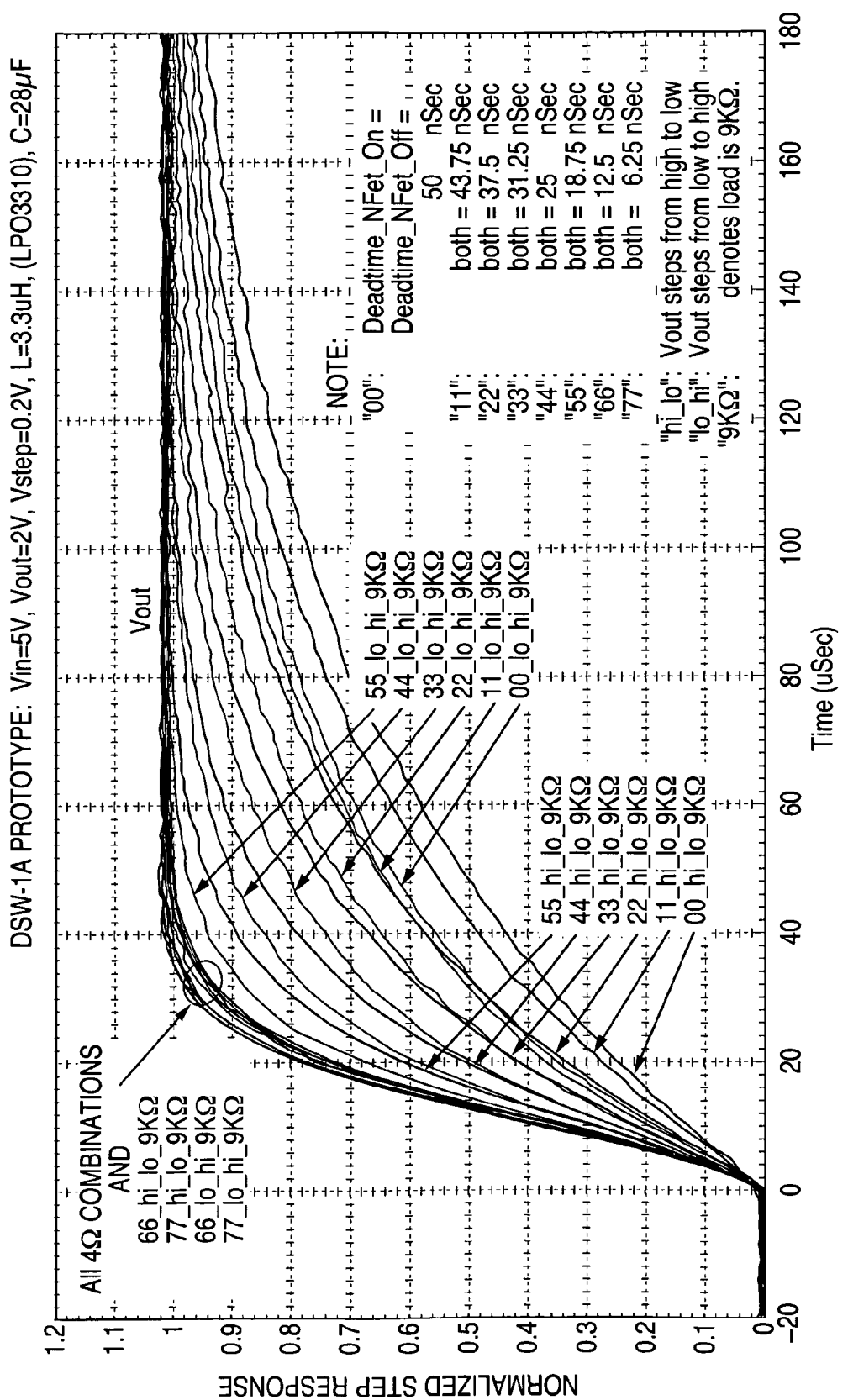
FIGS. 7A and 7B depict signal timing under various dead-time and load conditions for the output stage of FIG. 7.
Figure 7B:
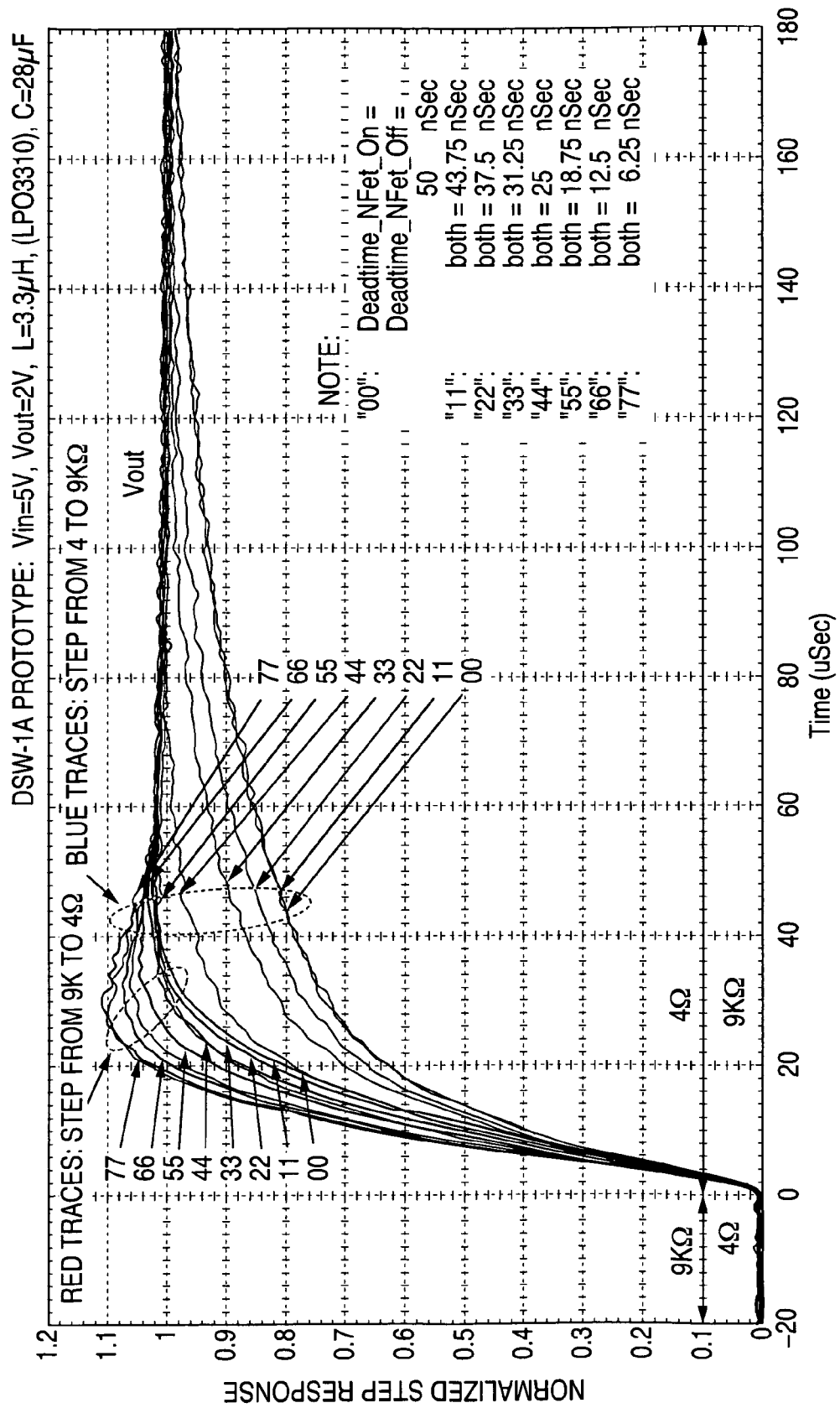

FIG. 7 illustrates the test configuration for PWM-step response tests and load-step response tests, the results of which are depicted in FIGS. 7A and 7B, respectively. The plots of FIGS. 7A and 7B show transient measurements of the prototype of FIG. 7 when the settings of both the dead-time register and the load are varied, the results of which were employed to extract the in-circuit parameters of the LC filter. In addition, these results were applied to FIG. 5, and a simplified version is shown in FIG. 3E.

The sliding error sampler architecture overcomes a number of inefficiencies. First, digital signal processing is attractive for many applications but has not been a practical solution for low cost, low power and high performance products such as power switchers. Traditional analog signal processing is still the de facto standard. Due to compromises between cost, power and performance, digital designs usually exhibit lower performance to cost and power ratios.

Second, newer and aggressive designs push the 0 dB gain frequency close to the PWM switching frequency for faster system responses. Latency further suffers when cost-cutting and power-efficiency features (e.g., variable serializing) are added to the loop. In order to maintain the loop stability, short latency is required.

Finally, new digital techniques proposed in the above-identified patent documents allow low cost and low power loop implementation. However, loop performance still suffers due to the long latency contributed from circuit registers. These registers are standard digital building blocks—designing out demands power and circuit parallelism.

The sliding error sampler solutions described above, SES-ADC and SES-PWM, each exhibit both low implementation cost and low power consumption. Both solutions provide missing links for allowing low cost and low power digital designs achieve good dynamic performance.

Although various embodiments have been described above in detail, those skilled in the art will understand that various changes, substitutions, variations, enhancements, nuances, gradations, lesser forms, alterations, revisions, improvements and knock-offs of the subject matter disclosed herein may be made without departing from the spirit and scope of the disclosure in its broadest form.

What is claimed is:

1. A sliding error sampler analog-to-digital converter system producing a digital signal representing a current error value for a current digital loop iteration, the system comprising:
   a predictor variably setting a timing for initiating analog-to-digital conversion of the current error value based on a magnitude of a previous error value for a previous digital loop iteration; and
   a timing unit receiving a signal from the predictor and triggering the analog-to-digital conversion based upon the timing set by the predictor.

2. The sliding error sampler analog-to-digital converter system according to claim 1, wherein the timing for initiating analog-to-digital conversion of the current error value is set by the predictor as a number of clock cycles in advance of a timing for reading the digital signal.

3. The sliding error sampler analog-to-digital converter system according to claim 2, wherein the predictor sets the timing for initiating analog-to-digital conversion of the current error value to a number of clock cycles selected based upon the magnitude of the previous error value plus at least one constant.

4. The sliding error sampler analog-to-digital converter system according to claim 3, wherein the at least one constant includes a first constant accommodating a fixed latency required to complete conversion and a second constant accommodating a variable latency corresponding to a step size between consecutive digital loop iterations.

5. The sliding error sampler analog-to-digital converter system according to claim 4, wherein a fixed value is selected for the second constant.

6. The sliding error sampler analog-to-digital converter system according to claim 1, wherein the digital signal is constrained to a maximum value whenever the current error value exceeds a predetermined value.

7. The sliding error sampler analog-to-digital converter system according to claim 1, wherein the current error value corresponds to a difference between a reference value and a current digital loop iteration output for the current digital loop iteration, the system further comprising:
an analog-to-digital converter performing the analog-to-digital conversion by producing the digital signal with a variable latency depending upon a magnitude of the current error value.

8. The sliding error sampler analog-to-digital converter system according to claim 7, further comprising:
a loop filter reading the digital signal during the current digital loop iteration, wherein the timing for initiating analog-to-digital conversion of the current error value is set by the predictor relative to a timing for the loop filter reading the digital signal.

9. The sliding error sampler analog-to-digital converter system according to claim 8, wherein the loop filter operates on the digital signal to produce the current digital loop iteration output with variable latency based upon the previous error value.

10. A power switcher including the sliding error sampler analog-to-digital converter system according to claim 9, the power switcher further comprising:
an output stage including an inductive-capacitive filter; and
a feedback signal providing the current digital loop iteration output to the analog-to-digital converter for use in determining a next error value for a next digital loop iteration.

11. A method of producing a digital signal representing a current error value for a current digital loop iteration, the method comprising:
in a predictor, variably setting a timing for initiating analog-to-digital conversion of the current error value based on a magnitude of a previous error value for a previous digital loop iteration; and
receiving a signal from the predictor and, in response, triggering the analog-to-digital conversion based upon the timing set by the predictor.

12. The method according to claim 11, wherein the timing for initiating analog-to-digital conversion of the current error value is set as a number of clock cycles in advance of a timing for reading the digital signal.

13. The method according to claim 12, wherein the timing for initiating analog-to-digital conversion of the current error value is set to a number of clock cycles selected based upon the magnitude of the previous error value plus at least one constant.

14. The method according to claim 13, wherein the at least one constant includes a first constant accommodating a fixed latency required to complete conversion and a second constant accommodating a variable latency corresponding to a step size between consecutive digital loop iterations.

15. The method according to claim 14, wherein a fixed value is selected for the second constant.

16. The method according to claim 11, wherein the digital signal is constrained to a maximum value whenever the current error value exceeds a predetermined value.

17. A method of producing a digital signal representing a current error value for a current digital loop iteration, the method comprising:
variably setting a timing for initiating analog-to-digital conversion of the current error value based on a magnitude of a previous error value for a previous digital loop iteration;
triggering the analog-to-digital conversion at the set timing; and
performing the analog-to-digital conversion by producing the digital signal with a variable latency depending upon a magnitude of the current error value,
wherein the current error value corresponds to a difference between a reference value and a current digital loop iteration output for the current digital loop iteration.

18. The method according to claim 17, further comprising:
reading the digital signal during the current digital loop iteration at the timing for reading the digital signal.

19. The method according to claim 18, further comprising:
operating on the digital signal to produce the current digital loop iteration output with variable latency based upon the previous error value.

20. The method according to claim 19, further comprising:
filtering using an inductive-capacitive filter to produce the current digital loop iteration output; and
providing the current digital loop iteration output to an analog-to-digital converter for use in determining a next error value for a next digital loop iteration.

* * * * *